(12) United States Patent
Brew et al.

(10) Patent No.: US 11,456,417 B2
(45) Date of Patent: Sep. 27, 2022

(54) INTEGRATED PHASE CHANGE MEMORY CELL PROJECTION LINER AND ETCH STOP LAYER

(71) Applicant: International Business Machines Corporation, Armonk, NY (US)

(72) Inventors: Kevin W. Brew, Niskayuna, NY (US); Injo Ok, Loudonville, NY (US); Iqbal Rashid Saraf, Glenmont, NY (US); Nicole Saulnier, Slingerlands, NY (US); Matthew Joseph BrightSky, Armonk, NY (US); Robert L. Bruce, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 17/104,360

(22) Filed: Nov. 25, 2020

(65) Prior Publication Data
US 2022/0165949 A1     May 26, 2022

(51) Int. Cl.
*H01L 45/00* (2006.01)
*H01L 27/24* (2006.01)

(52) U.S. Cl.
CPC ...... *H01L 45/1273* (2013.01); *H01L 27/2463* (2013.01); *H01L 45/06* (2013.01); *H01L 45/1233* (2013.01); *H01L 45/16* (2013.01)

(58) Field of Classification Search
CPC .................................................. H01L 27/2463
See application file for complete search history.

(56) References Cited

U.S. PATENT DOCUMENTS

| | | |
|---|---|---|
| 7,545,668 B2 | 6/2009 | Phillipp et al. |
| 7,642,125 B2 | 1/2010 | Lung et al. |
| 9,293,199 B2 | 3/2016 | Krebs et al. |
| 9,570,169 B1 | 2/2017 | Czornomaz et al. |
| 9,673,256 B2 | 6/2017 | Hu et al. |
| 10,290,804 B2 | 5/2019 | Ruiz et al. |
| 2008/0316793 A1 | 12/2008 | Phillipp et al. |
| 2012/0077309 A1 | 3/2012 | Chen |

(Continued)

FOREIGN PATENT DOCUMENTS

| | | |
|---|---|---|
| CN | 101546809 A | 9/2009 |
| CN | 106206938 A | 12/2016 |

(Continued)

OTHER PUBLICATIONS

Wabe W. Koelmans et al., "Projected phase-change memory devices," Nature Communications, vol. 6, No. 1 Sep. 3, 2015.

(Continued)

*Primary Examiner* — Mounir S Amer
(74) *Attorney, Agent, or Firm* — Matthew Zehrer (57) ABSTRACT

A mushroom type phase change memory (PCM) cell includes a projection liner located between a PCM volume and a bottom electrode. The projection liner has been retained from a layer previously utilized as an etch stop layer during the fabrication of PCM cell and/or the fabrication of the higher level IC device. The projection liner may extend beyond the PCM sidewall(s) or side boundary. This section of the projection liner may be located or buried under a dielectric or an encapsulation spacer and may increase thickness uniformity of the projection liner below the PCM volume.

15 Claims, 9 Drawing Sheets

(56) References Cited

U.S. PATENT DOCUMENTS

2015/0001457 A1   1/2015  Krebs et al.
2021/0066587 A1*  3/2021  Trinh .................... H01L 45/145

FOREIGN PATENT DOCUMENTS

| CN | 110098325 A   | 8/2019 |
|----|---------------|--------|
| KR | 20080039701 A | 5/2008 |
| KR | 20100037726 A | 4/2010 |

OTHER PUBLICATIONS

Sangbum Kim et al., "A phase change memory cell with metal nitride liner as a resistance stabilizer to reduce read current noise for MLC optimization," IEEE Transactions on Electron Devices, vol. 63, No. 10, 2016, pp. 3922-3927.
Notification of Transmittal of The International Search Report and The Written Opinion of the International Searching Authority, PCT/CN2021/129015, dated Jan. 28, 2022.

* cited by examiner

INTEGRATED PHASE CHANGE MEMORY CELL PROJECTION LINER AND ETCH STOP LAYER

FIELD

Embodiments of the invention relate generally to the field of semiconductor devices and, more particularly, to resistive memory devices, for example, phase change memory devices.

BACKGROUND

Phase-change memory (PCM) is a non-volatile solid-state memory technology that exploits the reversible, thermally-assisted switching of phase-change materials, in particular chalcogenide compounds such as Germanium-Antimony-Tellurium (GST), between states with different electrical resistance. The fundamental storage unit (the "cell") can be programmed into a number of different states, or levels, which exhibit different resistance characteristics. The programmable cell-states can be used to represent different data values, permitting storage of information.

In single-level PCM devices, each cell can be set to one of s=2 states, a "SET" state and a "RESET" state, permitting storage of one bit per cell. In the RESET state, which corresponds to a wholly amorphous state of the phase-change material, the electrical resistance of the cell is very high. By heating to a temperature above its crystallization point and then cooling, the phase-change material can be transformed into a low-resistance, fully-crystalline state. This low-resistance state provides the SET state of the cell. If the cell is then heated to a high temperature, above the melting point of the phase-change material, the material reverts to the fully-amorphous RESET state on rapid cooling. In multilevel PCM devices, the cell can be set to s>2 programmable states permitting storage of more than one bit per cell. The different programmable states correspond to different relative proportions of the amorphous and crystalline phases within the volume of phase-change material. In particular, in addition to the two states used for single-level operation, multilevel cells exploit intermediate states in which the cell contains different volumes of the amorphous phase within the otherwise crystalline PCM material. Since the two material phases exhibit a large resistance contrast, varying the size of the amorphous phase within the overall cell volume produces a corresponding variation in cell resistance.

Reading and writing of data in PCM cells is achieved by applying appropriate voltages to the phase-change material via a pair of electrodes associated with each cell. In a write operation, the resulting programming signal causes Joule heating of the phase-change material to an appropriate temperature to induce the desired cell-state on cooling. Reading of PCM cells is performed using cell resistance as a metric for cell-state. An applied read voltage causes a current to flow through the cell, this read current being dependent on resistance of the cell. Measurement of the cell read current therefore provides an indication of the programmed cell state. A sufficiently low read voltage is used for this resistance metric to ensure that application of the read voltage does not disturb the programmed cell state. Cell state detection can then be performed by comparing the resistance metric with predefined reference levels for the s programmable cell-states.

The further development of PCM faces several key challenges. One of these is that the amorphous phase of PCMs exhibit undesirable attributes such as low-frequency noise and drift. This drift causes resistance of the amorphous phase to increase in value over time. As a result, the read measurements for programmed cell states tend to vary with time. This complicates read out of the stored information, potentially even destroying the information if there is a large variability in the drift exhibited by different cell states so that the read measurement distributions for neighboring cell states interfere with one another. The larger the number of cell states, and so closer the initial spacing between readback resistance levels, the more susceptible cells are to this problem.

Figure 1:
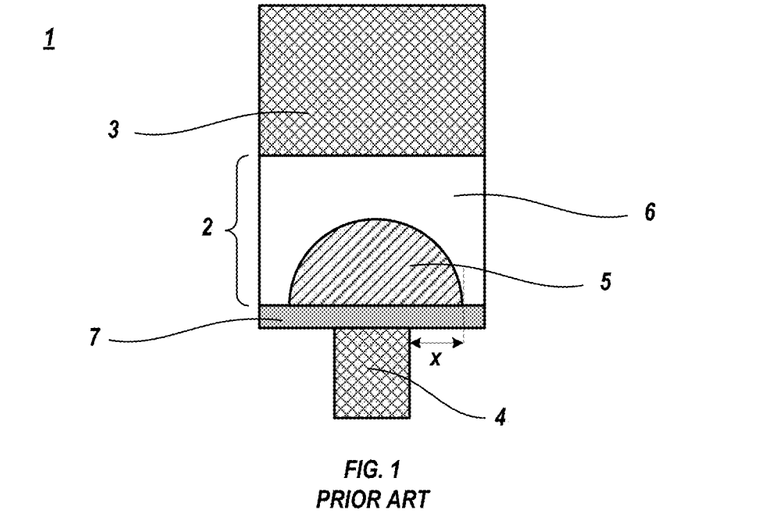
FIG. 1 depicts a prior art PCM memory cell.

Various techniques have been proposed to alleviate problems associated with resistance drift. One approach is illustrated in FIG. 1 of the accompanying drawings. This figure shows a schematic illustration of a mushroom type PCM cell 1 that has a volume of phase-change material 2 located between a top electrode 3 and a bottom electrode (or "heater") 4. The cell state shown represents an intermediate state in which the material 2 contains both crystalline and amorphous phases. The amorphous phase is indicated by the shaded hemispherical volume 5 above bottom electrode 4. The crystalline phase 6 occupies the remainder of the cell volume. A thin resistive region 7 provides a parallel current path between the bottom electrode 4 and the crystalline phase 6 of the phase-change material in operation. When a read voltage is applied to read the programmed cell-state, the resulting read current flows primarily via this current path from crystalline phase 6 to bottom electrode 4, in preference to flowing through the high-resistance amorphous phase 5. The measured cell resistance thus depends primarily on resistance of the parallel current path rather than the resistance of amorphous phase 5. The resistance of the parallel current path depends on the length "x" in the figure. This length is dependent on the size of amorphous phase 5, and thus varies with programmed cell state. Since the resistance of element 7 is unaffected by drift, the effect on the read measurement of resistance drift in amorphous phase 5 is mitigated.

During fabrication of a mushroom PCM cell, material(s) are typically deposited upon an underlying structure(s). Subsequently, undesired material(s) are subtractive removed and desired material(s) are retained. To increase reliability and yield of eventual retained material(s), it is often desired for previous undesired material(s) to be fully and completely removed.

SUMMARY

In an embodiment of the present invention, a phase change memory cell is presented. The phase change memory cell includes a bottom electrode and a projection liner, of electrically conductive material, that is connected to an upper surface of the bottom electrode. The phase change memory cell further includes a phase change volume, of phase change material, that is connected to an upper surface of the projection liner. The phase change memory cell further includes a top electrode that is connected to an upper surface of the phase change volume. The phase change memory cell further includes a dielectric that is connected to the upper surface of the projection liner, that is connected to a side surface of the phase change volume, and that is connected to a side surface of the top electrode.

In another embodiment of the present invention, an integrated circuit (IC) device fabrication method is presented. The method includes forming a bottom electrode upon a substrate and forming a projection liner, of electrically conductive material, directly upon the bottom electrode. The method further includes forming a phase change volume, of phase change material, directly upon an upper surface of the projection liner. The projection liner includes a first region below the phase change volume and a second region around the perimeter of the phase change volume. The method further includes forming a top electrode directly upon an upper surface of the phase change volume.

In another embodiment of the present invention, an integrated circuit (IC) device fabrication method is pretend. The method includes forming a projection liner layer upon a heating layer and upon a bottom electrode, forming a phase change material (PCM) layer upon the projection liner layer, and forming a top electrode layer upon the PCM layer. The method further includes forming a phase change material (PCM) stack upon the projection liner layer above the bottom electrode by etching away undesired PCM layer portions and undesired top electrode layer portions utilizing the projection liner layer as a first etch stop. The first etch exposes the projection liner layer outside of the PCM stack. The PCM stack includes a phase change volume, of phase change material, and a top electrode. The method further includes forming an encapsulation layer upon the exposed projection liner layer and upon the PCM stack. The method further includes forming an encapsulation spacer against sidewall(s) of the PCM stack by etching away undesired encapsulation spacer portions utilizing the projection liner layer as a second etch stop. The second etch re-exposing the projection liner layer outside of the encapsulation spacer.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 15A and FIG. 15 B depict various views of a bottom electrode of a PCM memory cell, in accordance with various embodiments of the present invention.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description and drawings, details of well-known features and techniques may be omitted to avoid unnecessarily obscuring the presented embodiments.

Referring to the drawings, wherein like components are labeled with like numerals, exemplary fabrication steps of forming an IC device that includes one or more PCM memory cells 100, are shown and described in greater detail below. It should be noted that while this description may refer to some components of the IC device in the singular tense, more than one component may be included within the IC device. The specific components depicted in the drawings and the cross section orientation was chosen to best illustrate the various embodiments described herein.

In PCM cells embodying the invention, a projection liner is located between a PCM and a bottom electrode. The projection liner has been retained from a layer previously utilized as an etch stop layer during the fabrication of PCM cell and/or the fabrication of the higher level IC device. The projection liner may extend beyond the PCM sidewall(s) or side boundary. In such implementations, this section of the projection liner may be located or buried under a dielectric or an encapsulation spacer. To fabricate the PCM cell and/or the IC device, clearing of undesired PCM and/or undesired encapsulation spacer material is adventurous to subsequent fabrication stages. In accordance with embodiments, this integrated projection liner/etch stop layer structure aids in the full removal of the undesired material(s), thereby increasing the reliability and yield of the IC device and/or PCM memory cell.

Figure 2A:
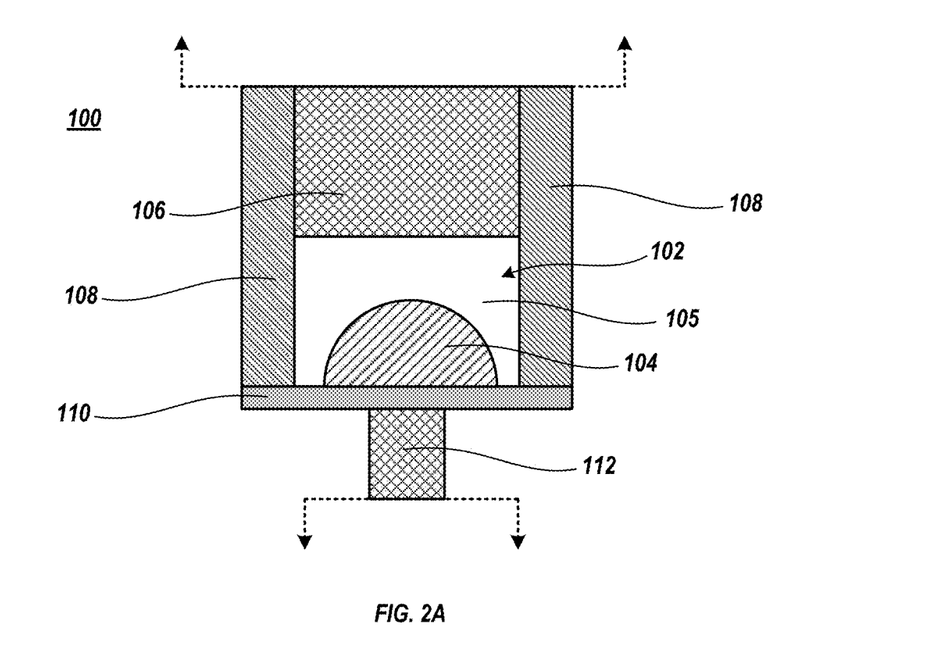
FIG. 2A depicts a cross section of a PCM memory cell that includes a projection liner, located between the PCM and a bottom electrode, that is retained from an etch stop layer, in accordance with various embodiments of the present invention.

FIG. 2A depicts mushroom type PCM memory cell 100, in accordance with various embodiments of the present invention. PCM memory cell 100 includes a volume of PCM 102 located between a top electrode 106 and a bottom electrode 112. The cell state shown represents an intermediate state in which the PCM 102 contains both crystalline and amorphous phases. The amorphous phase is indicated by the shaded hemispherical volume 104 above bottom electrode 112. The crystalline phase 105 occupies the remainder of the PCM 102 volume. A resistive projection liner 110 provides a parallel current path between the bottom electrode 112 and the crystalline phase 105 of the PCM 102 in operation. When a read voltage is applied to read the programmed cell-state, the resulting read current flows primarily via this current path from crystalline phase 105 to bottom electrode 112, in preference to flowing through the high-resistance amorphous phase 104. The measured cell resistance thus depends primarily on resistance of the parallel current path rather than the resistance of amorphous phase 104.

The projection liner 110 is located between and electrically connected to the PCM 102 and bottom electrode 112. In accordance with embodiments, the projection liner 110 has been retained from a layer previously utilized as an etch stop layer during the fabrication of PCM cell 100 and/or the fabrication of the higher level IC device that which contains the PCM cell 100. The projection liner 110 may extend beyond sidewall(s) or side boundary of the PCM 102 volume. In other words, the width of projection liner 110 is greater than the width of the PCM 102 volume. In such implementations, this section of the projection liner 102 may be located between encapsulation spacer(s) 108 and heater layer 310, shown for example in FIG. 3. It may be adventurous for the projection liner 110 to extend beyond sidewall(s) or side boundary of the PCM 102 volume there above since such extensions increase the likelihood of the projection liner 110 having a uniform thickness underneath the PCM 102 volume (e.g., there are no damaged corners or varying thicknesses of the projection liner 110 below PCM 102, etc.).

The encapsulation spacer(s) 108 are located upon or otherwise connected to the sidewall or side boundary of the PCM 102 volume and the sidewall or the side boundary of the top electrode 106. An upper surface of the encapsulation spacer(s) 108 may be coplanar with the upper surface of the top electrode 106 and a lower surface of the encapsulation spacer(s) 108 may be coplanar with the lower surface of the PCM volume 102. Alternatively, the upper surface of encapsulation spacer(s) 108 may be between the upper surface of the top electrode 106 and the bottom surface of top electrode.

Figure 11:
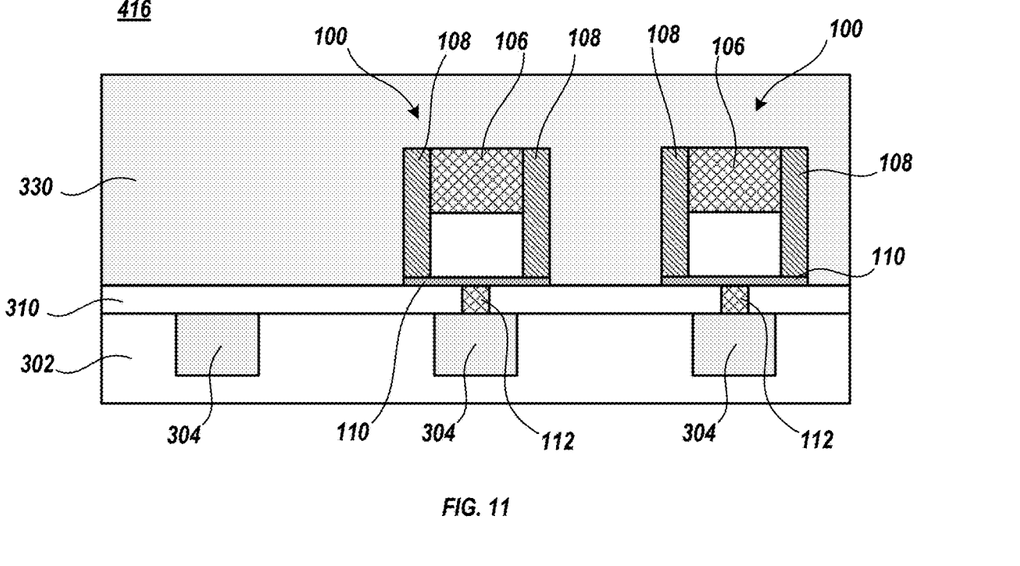

The encapsulation spacer(s) 108 generally cover the PCM material 102 volume and protect the 102 volume from ILD 330 formation, shown for example, in FIG. 11. For example, the encapsulation spacer(s) 108 layer prevents any oxide or nitride invading into the PCM material 102 during ILD 330 formation.

A sidewall(s) of the encapsulation spacer(s) 108 may be coplanar with a sidewall(s) of the projection liner 110. For example, a left sidewall of the projection liner 110 may be coplanar with a left sidewall of a spacer 108 located on the left side of the PCM 102 volume and a right sidewall of the projection liner 110 may be coplanar with a right sidewall of a spacer 108 located on the right side of the PCM 102 volume.

In some implementations, encapsulation spacers 108 may be omitted and ILD 330, shown for example in FIG. 11, may be formed in place thereof (i.e., ILD 330 may contact the sidewalls of the PCM stack and contact the region of the projection liner 110 that extends outside of the PCM stack).

In embodiments, the PCM cell 100 may be included in a higher level IC device, such as a processor, memory, FPGA, EEPROM, or the like. The IC device may further include a bottom wire that is electrically connected to the bottom electrode 112 and may include an upper wire that is electrically connected to the top electrode 106.

In some implementations, PCM memory cell 100 includes a single bottom electrode 112 that contacts a single bottom wire or a single wiring pathway. In other implementations, PCM memory cell 100 includes multiple bottom electrodes 112, each of which connected to an independent bottom wire or independent bottom wire pathways. In these implementations, the top electrode 106 may act as a shared electrode.

Figure 2B:
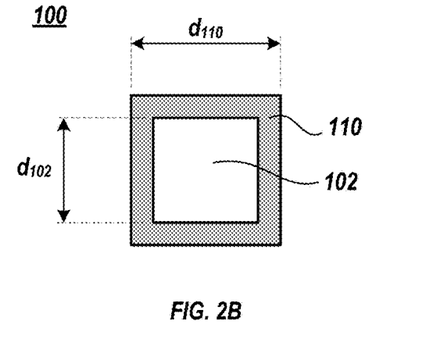
FIG. 2B and FIG. 2C depict a top view of a projection liner and PCM volume of a PCM memory cell, in accordance with various embodiments of the present invention.
Figure 2C:
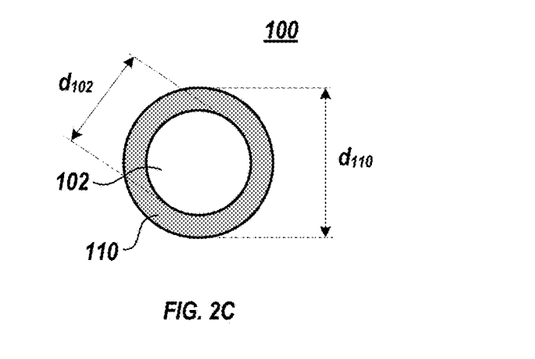

FIG. 2B and FIG. 2C depict a top view of a projection liner and PCM volume of a PCM memory cell, in accordance with various embodiments of the present invention. The projection liner 110 includes a portion, which may be referred to herein as an extension region, that extends beyond or outside the perimeter of the PCM 102 volume. As such, the extension region may be buried under spacer(s) 108 or buried under ILD 330. The projection liner 110 also includes a portion, which may be referred to herein as the current path region, under the PCM 102 volume.

As shown in FIG. 2B, memory cell 100 may be arranged as a square, rectangular, or polygonal shaped pillar. The PCM 102 diameter $d_{102}$ is smaller than the projection liner 110 diameter $d_{110}$, thereby forming the extension region around the perimeter of the generally polygonal PCM 102 volume perimeter. As shown in FIG. 2C, memory cell 100 may be arranged as a rounded or circle shaped pillar or cylinder. The PCM 102 diameter $d_{102}$ is smaller than the projection liner 110 diameter $d_{110}$, thereby forming the extension region around the perimeter of the generally rounded PCM 102 volume perimeter.

Though the overhead shape of PCM 102 volume and projection liner 110 are shown as a similar or the same shape, the shape of PCM 102 volume and projection liner 110 may be different.

Figure 3:
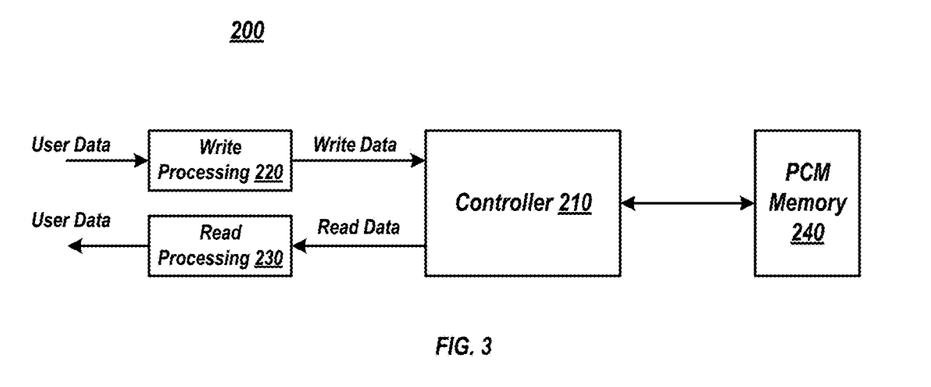
FIG. 3 is a block diagram of a PCM memory device embodying the PCM memory cell of FIG. 2, in accordance with various embodiments of the present invention.

FIG. 3 is a block diagram of a PCM memory device 200 embodying the PCM memory cell 100, in accordance with various embodiments of the present invention. Device 10 includes PCM memory 240 for storing data in and/or reading data from at least one PCM cell and/or at least one integrated array of PCM cells 100. Reading and writing of data to memory 240 may be performed by a read/write controller, or controller, 210. Controller 210 includes circuitry of generally known form for programming PCM cells during data write operations and making read measurements for detecting cell-state during data read operations. During these operations, the read/write controller can address individual PCM cells by applying appropriate control signals to an array of word and bit lines in memory ensemble 240. User data input to device 200 is typically subjected to some form of write-processing, such as coding for error-correction purposes, by write-processing module 220, before being supplied as write data to controller 210. Similarly, read data by controller 210 is generally processed by a read-processing module 230, e.g., for codeword detection and/or error correction, to recover the original input user data.

The PCM cells of memory 240 can store information in at least three programmable cell states. As discussed earlier, the programmable cell-states correspond to different relative proportions of the amorphous and crystalline phases within the PCM material of the cell. These states include at least a high-resistance, fully-amorphous RESET state, a low-resistance, fully-crystalline SET state, and at least one intermediate state corresponding to increasing size of the amorphous phase within the otherwise crystalline PCM material. The programmable cell-states are typically defined in controller 210 in terms of predetermined reference values, or ranges of values, of the resistance metric used for read detection. To program a PCM cell in a write operation, controller 210 applies a voltage to the cell via the word and bit lines such that the resulting programming signal sets the cell to the required state. In a read operation, a (lower) read voltage is applied to the cell and the resulting cell current is measured to obtain the resistance metric. Controller 210 can then detect the programmed cell state by comparing the read metric with the aforementioned reference values.

Figure 4:
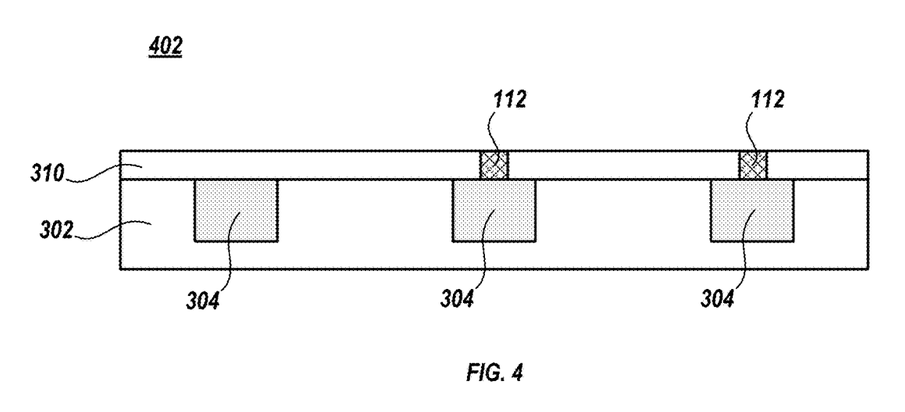
FIG. 4 through FIG. 13 depict cross-sectional views of fabrication stages of a fabrication method of forming an IC device that includes one or more PCM memory cells, in accordance with various embodiments of the present invention.

FIG. 4 depicts a cross-sectional view of an IC device fabrication stage 402 of a fabrication method of forming the IC device that includes at least one PCM memory cell 100, in accordance with various embodiments of the present invention. At stage 402, a heating layer 310 is formed on top of a substrate 302. The heating layer 310 may be, for example, a Silicon layer or Silicon-based layer such as Silicon Nitride layer. A bottom electrode 112 is formed within the heating layer 310 by any method known in the art. For example, a trench may be formed within the heating layer 310 and then filled with the bottom electrode 112 material. Chemical mechanical planarization, or other known methods, may be used to remove excess bottom electrode 112 material from the upper surface of heating layer 310. The bottom electrode 112 material may be any generally conductive material that is used as an electrode, such as, for example, Tungsten, Platinum, Titanium Nitride, Tantunum Nitride, Titanium Aluminum Nitride, or the like.

In certain implementations, the trench is formed though the heating layer 310, thereby exposing a portion of an upper surface of a bottom wire 304 previously formed in substrate 302. As such, the bottom electrode 112 may contact bottom wire 304. Bottom wire 304 may be electrically connected to other components of the IC device by one or more electrical pathways, as is known in the art. For example, one or more electrical pathways may connect bottom wire 304 with controller 210. In this manner, components of the IC device may be electrically connected to bottom electrode 112.

Figure 5:
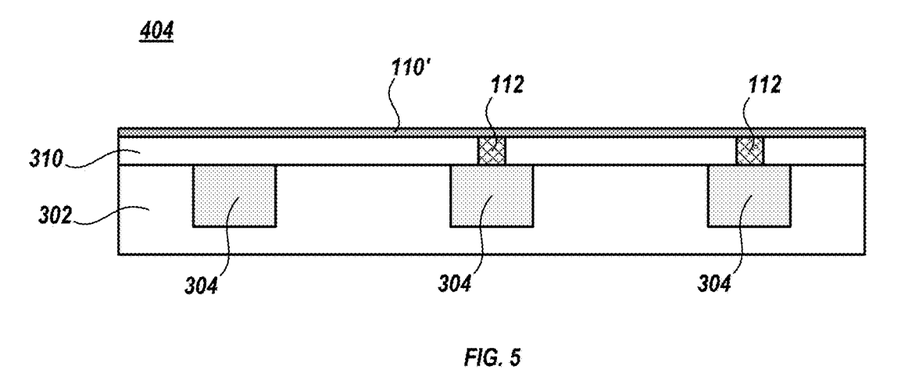

FIG. 5 depicts a cross-sectional view of an IC device fabrication stage 404 of a fabrication method of forming the IC device that includes at least one PCM memory cell 100, in accordance with various embodiments of the present invention. At stage 404, projection liner layer 110' is formed upon the heating layer 310 and upon the bottom electrode 112. Projection liner layer 110' is an electrically conductive layer that has a sheet resistance between the resistance of the amorphous phase of the PCM 102 volume and the resistance of the crystalline phase of the PCM 102 volume. For example, the sheet resistance of liner 110' may be between 10 kohm/sq and 10000 kohm/sq. Further, projection liner layer 110' may have a highly selective etch capability with respect to the material that forms encapsulation spacer(s) 108. Projection liner layer 110' may be formed to a thickness between 1 and 10 nm. In a preferred embodiment, projection liner layer 110' may be formed to a thickness between 1 and 6 nm. The projection liner layer 110' may be, for example, a Tantunum Nitride layer, Titanium Aluminum Nitride layer, an amorphous Carbon layer.

Figure 6:
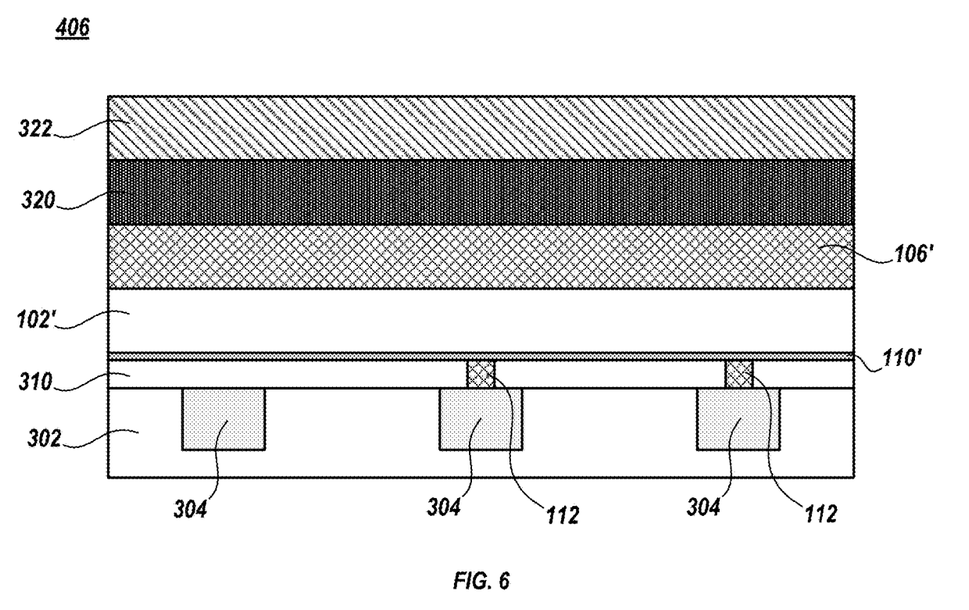

FIG. 6 depicts a cross-sectional view of an IC device fabrication stage 406 of a fabrication method of forming the IC device that includes at least one PCM memory cell 100, in accordance with various embodiments of the present invention. At stage 406, PCM layer 102' is formed upon the projection liner layer 110', top electrode layer 106' is formed upon the PCM layer 102', a mask layer 320 is formed upon the top electrode layer 106', and/or a developer layer 322 is formed upon the mask layer 320.

PCM layer 102' may be formed upon the projection liner layer 110' by depositing phase change material onto the projection liner layer 110'. Phase change material may be any known or future developed variable resistance material whose resistance changes according to its temperature dependent material phase such as, for example, various combinations of Ge, Sb and Te, which may be collectively referred to as GST materials. Specifically, GSTs can change structural phases between an amorphous phase and two crystalline phases. The resistance of the amorphous phase ("a-GST") and the resistances of the cubic and hexagonal crystalline phases ("c-GST" and "h-GST," respectively) can differ significantly. The resistance of amorphous GST is greater than the resistances of either cubic GST or hexagonal GST, which may be referred to herein as the resistance of the crystalline phase, whose resistances are similar to each other. Thus, in comparing the resistances of the various phases of GST, GST may be considered a two-state material (amorphous GST and crystalline GST), with each state having a different resistance that can be equated with a corresponding binary state.

The transition from one GST phase to another occurs in response to temperature changes of the GST material. GST material has a melting temperature Tm and a crystallization temperature Tx. The crystallization temperature Tx is lower than the melting temperature Tm. Both the crystallization temperature Tx and the melting temperature Tm are higher than room temperature. When the GST material is heated above the melting temperature Tm, the GST material loses its crystalline structure. If the GST material is then rapidly cooled to room temperature, the GST material is formed into an amorphous state—the cooling occurs too fast to allow a crystalline structure to grow. On the other hand, if the GST material is warmed to a temperature above the crystallization temperature Tx but below the melting temperature Tm, a crystalline structure is able to grow. Once converted into a crystalline structure, the GST material remains in a crystalline structure until it is again heated above the melting temperature Tm. In other words, at room temperature, the GST material is stable in either the amorphous or crystalline phases.

PCM layer 102' may be formed to a thickness between 3 and 150 nm. In a preferred embodiment, PCM layer 102' may be formed to a thickness between 10 and 100 nm.

Top electrode layer 106' may be formed upon the PCM layer 102' by depositing electrically conductive material upon the PCM layer 102'. The top electrode layer 106' is generally, but not required, formed of the same material as the material of the bottom electrode 112. Top electrode layer 106' may be formed to a thickness between 10 and 150 nm. In a preferred embodiment, top electrode layer 106' may be formed to a thickness between 25 and 100 nm.

Mask layer 320 may be formed upon the top electrode layer 106' by depositing one or more known mask materials, such as Silicon Nitride, upon top electrode layer 106'. The developer layer 322 may be formed upon the mask layer 320 by depositing one or more known developer materials, that may be used to pattern the underlying mask layer 320, upon the mask layer 320. Known photolithography techniques may be utilized to selectively remove or develop portions of the mask layer 320 so that the only a remaining portion of the mask layer 320 is located generally above and in line with a respective bottom electrode 112, in order to define and protect a respective PCM stack of the PCM 102 volume and top electrode 106 there below.

Figure 7:
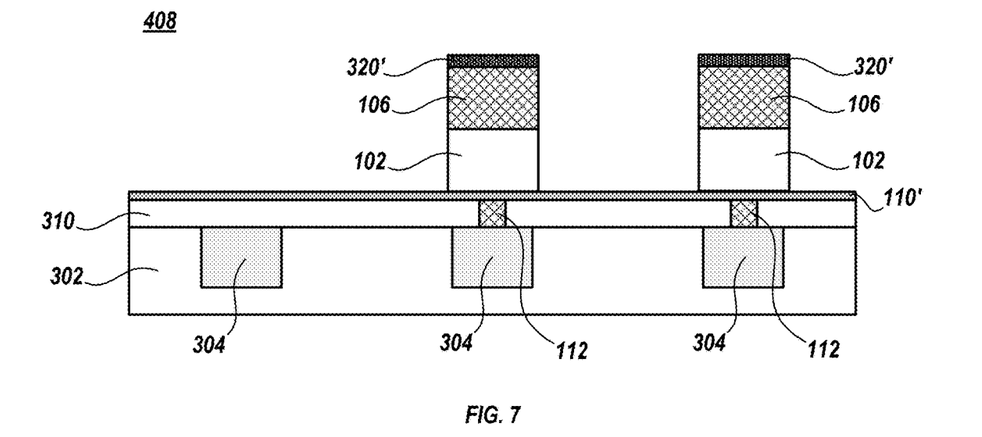

FIG. 7 depicts a cross-sectional view of an IC device fabrication stage 408 of a fabrication method of forming the IC device that includes at least one PCM memory cell 100, in accordance with various embodiments of the present invention. At stage 408, an etching technique removes undesired or exposed PCM layer 102' material and undesired or exposed top electrode layer 106' material.

The developed or patterned mask 320' portions may protect the underlying desired PCM layer 102' material and top electrode layer 106' material from the etchant of a chemical etch or high energy kinetic energy (ion, electron, or photon) beams of a dry etch. The protected underlying desired PCM layer 102' material and top electrode layer 106' material is thereby retained and effectively forms the PCM 102 volume and the top electrode 106, respectively. In some implementations, one or more patterned mask 320' portions upon respective PCM 102 volume(s) may be retained and not fully removed by the stage 408 etch. As the PCM 102 volume and the is formed from the PCM layer 102' material and top electrode 106 is formed from the top electrode layer 106' material, the PCM 102 volume share the material properties of PCM layer 102' material and the top electrode 106 share the material properties of the top electrode layer 106' material.

In accordance with embodiments of the present invention, the projection liner layer 110' is utilized as the stop layer in which the etchant or ion beams stops upon and exposes field portions of the projection liner layer 110' that are outside of the formed PCM stack(s) of the PCM 102 volume(s) and top electrode(s) 106. By utilizing the projection liner layer 110' as an etch stop, undesired PCM layer 102' material may be fully removed from the field portions of the projection liner layer 110'.

The etch technique utilized in stage 408 may be a physical or dry etch technique or a chemical wet etch. In a preferred implementation, the etch technique of stage 408 is a physical dry etch and, as such, there is less risk for damage (e.g., limited lateral etching of the PCM material may be experienced due to the lack of chemical etchants) to the desired and retained PCM 102 volumes.

In preferred implementations, multiple PCM stacks are fabricated at stage 408 arranged as pillars, as is known in the art. Further, in certain implementations the sidewall(s) or side surface(s) of at least the PCM 102 volume within the PCM stacks may be passivated, as is known in the art. The etch of stage 408 may generally create coplanar sidewall(s) or side surfaces of the PCM 102 volume and top electrode 106 of the PCM stack.

Figure 8:
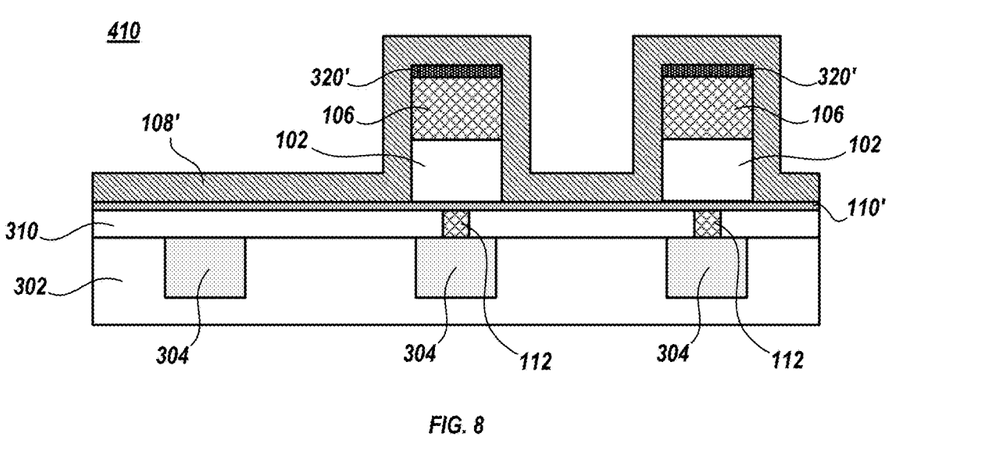

FIG. 8 depicts a cross-sectional view of an IC device fabrication stage 410 of a fabrication method of forming the IC device that includes at least one PCM memory cell 100, in accordance with various embodiments of the present invention. At stage 410, an encapsulation layer 108' is formed upon the exposed field portions of the projection liner layer 110' and upon and around the formed PCM stack.

Encapsulation layer 108' is a dielectric material layer that when encapsulation spacers 108 are formed therefrom protect PCM volume 102 material during subsequent fabrication stages. For example, encapsulation spacer(s) 108 protect oxide and/or nitride from invading into the PCM volume 102 material during ILD 330 formation.

Encapsulation layer 108' may be formed by depositing a dielectric material, such as Silicon Nitride, Silicon Oxynitride, Carbon-doped Silicon Nitride, Aluminium Oxide, Hafnium Dioxide, or the like, upon the exposed field portions of the projection liner layer 110', upon the PCM stack sidewall(s) and upper surface. For example, encapsulation layer 108' may be formed by depositing a blanket dielectric material layer upon the previously exposed field portions of the projection liner layer 110', upon the sidewall(s) or side surface(s) of the PCM 102 volume, upon the sidewall(s) or side surface(s) of the top electrode 106, and upon the upper surface of top electrode 106 (if patterned mask 320' portions are not present). When a patterned mask 320' portion is present in PCM 102 stack, as is depicted in FIG. 7, the blanket dielectric material layer may be deposited upon the previously exposed field portions of the projection liner layer 110', upon the sidewall(s) or side surface(s) of the PCM 102 volume, upon the sidewall(s) or side surface(s) of the top electrode 106, upon the sidewall(s) or side surface(s) of the patterned mask 320' portion, and upon the upper surface of patterned mask 320' portion.

The thickness of the encapsulation layer 108' may be sufficiently thick to protect the PCM stack, and more specifically the PCM 102 volume, during the directional etching of the encapsulation spacer layer 108' so that undesired encapsulation spacer layer 108' may be removed from the field while being retained upon the PCM stack sidewall(s) or side surface(s). For, example, encapsulation layer 108' may be formed to a thickness between 6 and 100 nm. In a preferred embodiment, encapsulation layer 108' may be formed to a thickness between 12 and 50 nm.

Figure 9:
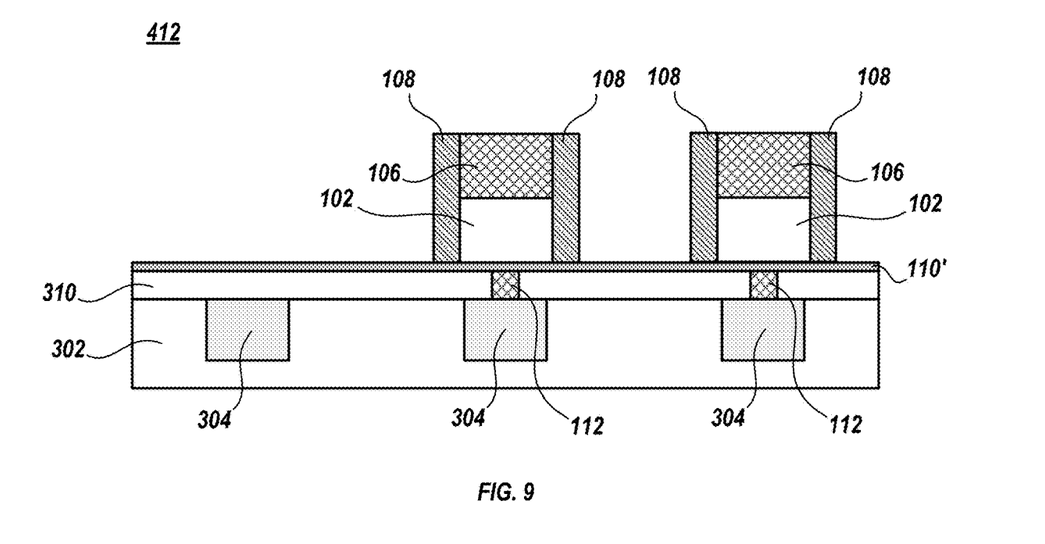

FIG. 9 depicts a cross-sectional view of an IC device fabrication stage 412 of a fabrication method of forming the IC device that includes at least one PCM memory cell 100, in accordance with various embodiments of the present invention. At stage 412, undesired encapsulation layer 108' portion(s) are etched away while desired encapsulation layer 108' portion(s) are retained upon the sidewall(s) of the PCM stack of the PCM 102 volume and top electrode 106 to form encapsulation spacer(s) 108.

Known directional etch techniques may be utilized to etch away or otherwise remove the undesired encapsulation layer 108' portion(s). These undesired encapsulation layer 108' portion(s) may be generally horizontal as depicted in the cross section view of FIG. 9 (i.e. layer portion(s) with width greater than height). The directional etch process may retain the desired encapsulation layer 108' portion(s) that are upon the sidewall(s) of the PCM stack of the PCM 102 volume and top electrode 106. These desired encapsulation layer 108' portion(s) may be generally vertical as depicted in the cross section view of FIG. 9 (i.e. layer portion(s) with height greater than width).

The desired encapsulation layer 108' portion(s) located upon the sidewall(s) or side surface(s) of the PCM stack of the PCM 102 volume and top electrode 106 effectively forms the encapsulation spacer 108. As the encapsulation spacer(s) 108 are formed from the encapsulation layer 108' material, the encapsulation spacer(s) 108 share the material properties of encapsulation layer 108' material.

The encapsulation spacer(s) 108 are formed from the encapsulation layer 108' such that the encapsulation spacer(s) 108 are located upon or otherwise connected to the sidewall(s) or side surface(s) of the PCM 102 volume and the sidewall(s) or the side surface(s) of the top electrode 106 (i.e., upon the sidewall(s) of the PCM stack). Further, the encapsulation spacer(s) 108 may be formed from the encapsulation layer 108' such that the upper surface of the encapsulation spacer(s) 108 is be coplanar with the upper surface of the top electrode 106 and a lower surface of the encapsulation spacer(s) 108 may be coplanar with the lower surface of the PCM volume 102.

In accordance with embodiments of the present invention, the projection liner layer 110' may again be utilized as the stop layer in which the etch stops upon and exposes field portions of the projection liner layer 110' that are outside of the encapsulation spacer(s) 108 that are upon the sidewalls of the PCM stack(s). By utilizing the projection liner layer 110' as an etch stop, undesired encapsulation layer 108' material may be fully removed from these field portions of the projection liner layer 110'.

The etch technique utilized in stage 412 may be a physical or dry etch technique or a chemical wet etch. In a preferred implementation, the etch technique of stage 412 is a chemical wet etch. As such, the projection liner layer 110' may be configured to be a etch stop layer to different types of etches.

In the implementations, where patterned mask 320' portion(s) are retained upon PCM stack(s), respectively, utilizing the projection liner layer 110' as a etch stop is beneficial to fully remove these field portions of the encapsulation layer 108' that are outside of the encapsulation spacer(s) 108 while allowing to engineer a precise etching interaction to remove the patterned mask 320' portion(s) and/or encapsulation layer 108' stopping at the upper surface of the top electrode(s) 106 of the PCM stack(s). Once the encapsulation spacers 108 are resultantly precisely formed, then a subsequent controlled etch of the projection liner layer 110' itself to remove undesired portions thereof further provides a more uniform surface of field portions of heating layer 310 outside of the PCM stack(s).

Figure 10:
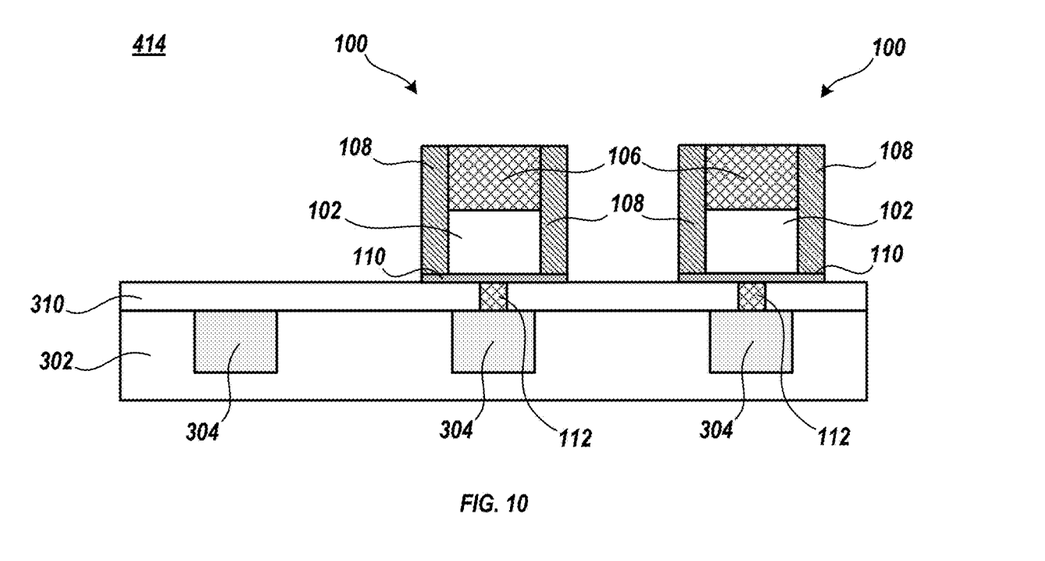

FIG. 10 depicts a cross-sectional view of an IC device fabrication stage 414 of a fabrication method of forming the IC device that includes at least one PCM memory cell 100, in accordance with various embodiments of the present invention. At stage 414, undesired projection liner layer 110' material located in field portions that are outside of the encapsulation spacer(s) 108 are removed. Further at stage 414, desired projection liner layer 110' material located under the encapsulation spacer(s) 108 (i.e., the projection liner layer 110' in the extension region) and desired projection liner layer 110' material under the PCM 102 volume (i.e., the projection liner layer 110' in the current path region) are retained to form projection liner(s) 100, respectively.

Known etch techniques may be utilized to etch away or otherwise remove the undesired projection liner layer 110' material. The encapsulation spacer(s) 108 are formed from the encapsulation layer 108'. Sidewall(s) of the projection liner(s) 100, respectively may be coplanar with sidewall(s) of the encapsulation spacer(s) 108. For example, a left sidewall of a projection liner 110 may be coplanar with a left sidewall of a spacer 108 located on the left side of the PCM stack and a right sidewall of the projection liner 110 may be coplanar with a right sidewall of a spacer 108 located on the right side of the PCM stack. In certain implantations, upon formation of projection liner 110 at stage 414, PCM memory cell 100 may be formed or otherwise fabricated.

FIG. 11 depicts a cross-sectional view of an IC device fabrication stage 416 of a fabrication method of forming the IC device that includes at least one PCM memory cell 100, in accordance with various embodiments of the present invention. At stage 416, inter layer dielectric (ILD) 330 is formed upon the heater layer 310 and upon and around the PCM cell 100.

ILD 330 may be formed by depositing a blanket layer of dielectric material, such as X, Tetraethyl orthosilicate (TEOS), Silaketenylidene (SiCO), or the like, upon the heater layer 310 and upon and around the PCM cell 100. ILD 330 may be formed to a thickness generally greater than the height, or generally above, the upper surface of top electrode 106. For example, ILD 330 may be formed to a thickness between 150 and 1500 nm. In a preferred embodiment, IDL 330 may be formed to a thickness between 200 and 1000 nm.

In alternative implementations, ILD 330 may be formed to a thickness generally coplanar with the upper surface of top electrode 106. In these implementations, a VIA (Vertical Interconnect Access) 356, exemplary shown in FIG. 13, may be formed through the ILD 330 to contact bottom wire 304 and another or second ILD layer may be formed upon the ILD 330 and upon the VIA 356. Subsequently, top wire 354 may be formed through the second ILD layer to contact the VIA 356 and top wire 350 may be formed through the second ILD layer to contact top electrode 106, as is exemplary shown in FIG. 13.

For clarity, in some implementations, encapsulation spacers 108 may be omitted and ILD 330 may be further formed in place thereof (i.e., ILD 330 may further be formed upon the sidewalls of the PCM stack and upon the region of the projection liner 110 that extends outside of the PCM stack).

Figure 12:
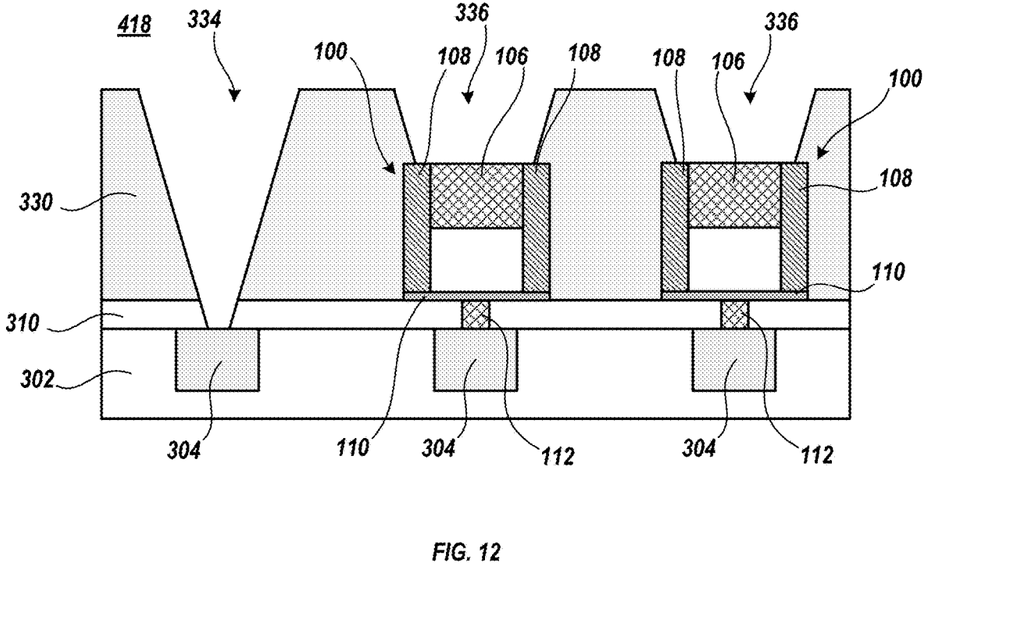

FIG. 12 depicts a cross-sectional view of an IC device fabrication stage 418 of a fabrication method of forming the IC device that includes at least one PCM memory cell 100, in accordance with various embodiments of the present invention. At stage 418, wiring trench(es) 334, 336 are formed within ILD 330. Wiring trench(es) 334, 336 may be formed by known selective removal techniques to remove undesired portions of ILD 330 generally above bottom wire 304 and/or generally above top electrode 106, respectively. Wiring trench(es) 334, 336 generally expose at least a portion of an underlying conductive structure, respectively. For example, wire trench 334 exposes a portion or the entire upper surface of bottom wire 304 and wire trench 336 exposes a portion or the entire upper surface of top electrode 106. In a preferred implementation, as depicted, wire trench 336 exposes the entire upper surface of top electrode 106 and further exposes a portion(s) of the upper surface(es) of the neighboring encapsulation spacer(s) 108, respectively. Known etching techniques may be utilized to form wiring trenches with orthogonal type sidewall(s) (i.e. parallel to the sidewalls of encapsulation spacer(s) 108) or to form wiring trenches with sloped type sidewalls(s), as depicted.

Figure 13:
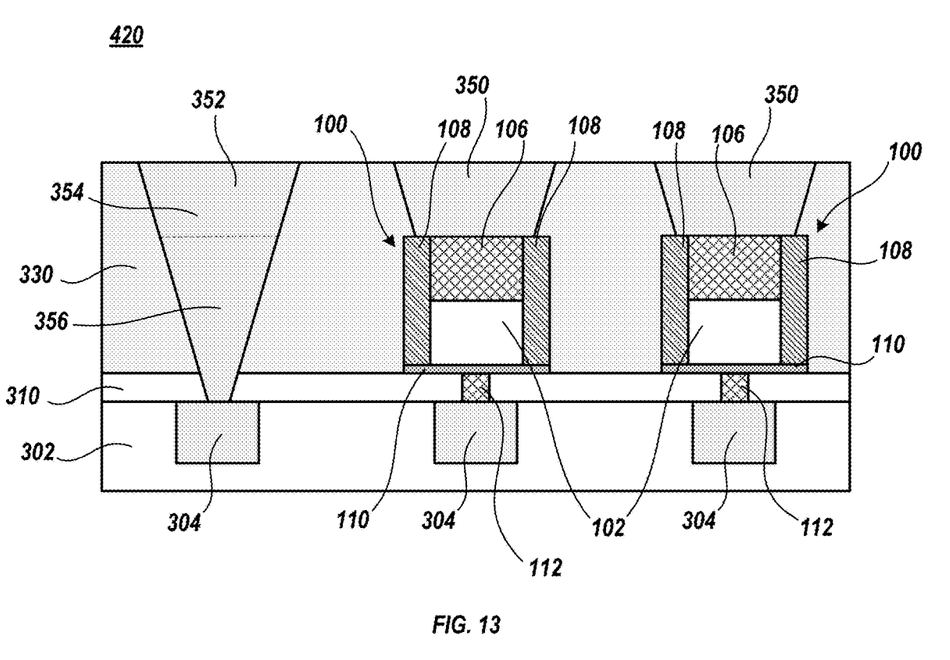

FIG. 13 depicts a cross-sectional view of an IC device fabrication stage 420 of a fabrication method of forming the IC device that includes at least one PCM memory cell 100, in accordance with various embodiments of the present invention. At stage 420, top wire 350 and wire 352 are formed within wiring trench(es) 334, 336, respectively. Top wire 350 and wire 352 may be formed by depositing electrically conductive material within wiring trench(es) 334, 336, respectively. As wiring trench(es) 334, 336 expose at least a portion of an underlying conductive structure, top wire 350 and wire 352 are in contact with the underlying conductive structure, respectively. For example, wire 352 contacts a portion or the entire upper surface of bottom wire 304 and top wire 354 contacts a portion or the entire upper surface of top electrode 106. In a preferred implementation, as depicted, top wire 350 contacts the entire upper surface of top electrode 106 and further contacts at least a portion(s) of the upper surface(es) of the neighboring encapsulation spacer(s) 108, respectively. In some implementations, wire 352 may take the form of a top wire 354 formed upon and contacting VIA 356 there below.

Top wire 350 may be electrically connected to other components of the IC device by one or more electrical pathways, as is known in the art. For example, one or more electrical pathways may connect top wire 350 with controller 210. In this manner, components of the IC device may be electrically connected to top electrode 106.

Figure 14:
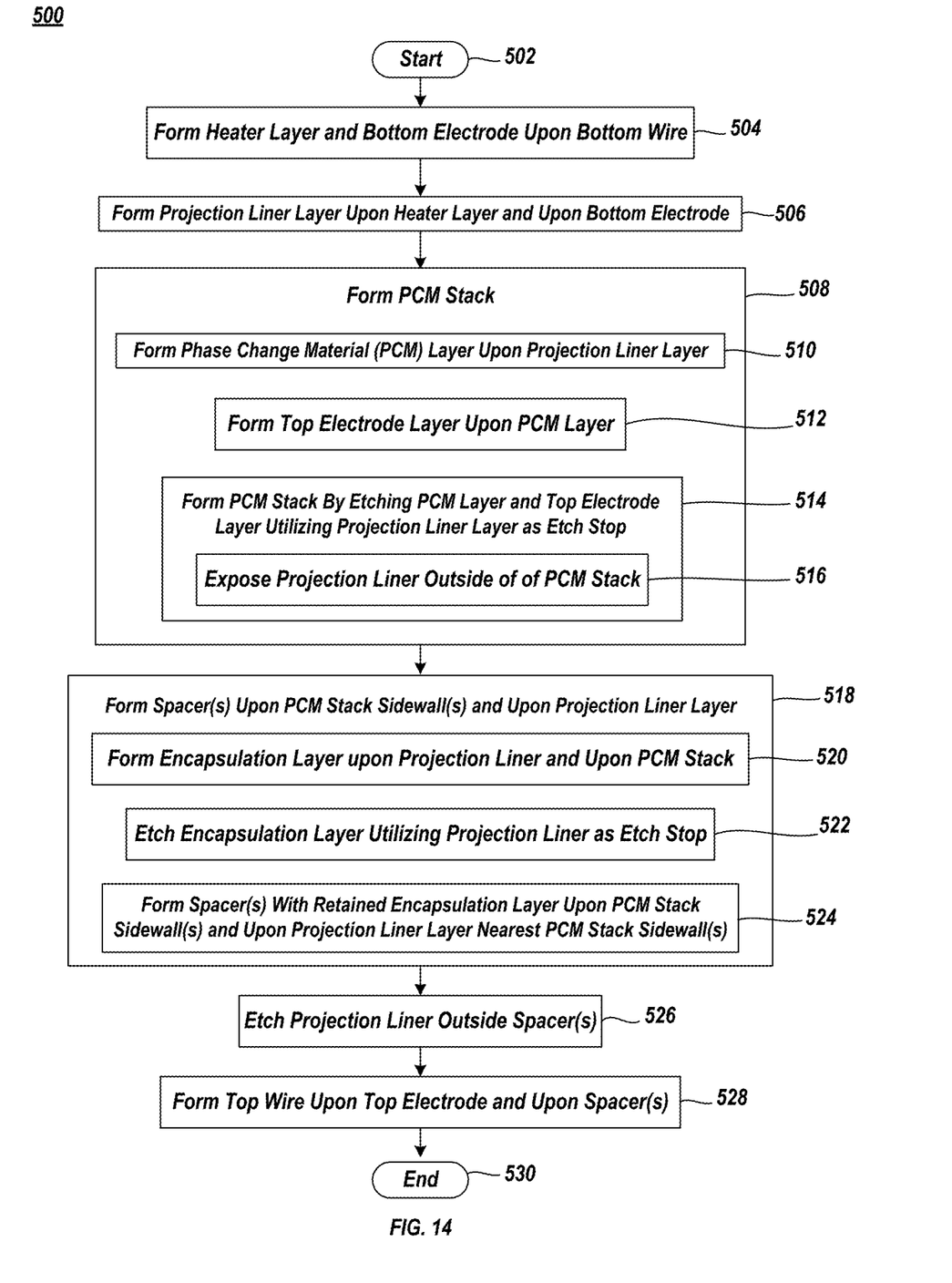
FIG. 14 depicts an integrated circuit (IC) device fabrication method, in accordance with various embodiments of the present invention.

FIG. 14 depicts an integrated circuit (IC) device fabrication method 500, in accordance with various embodiments of the present invention. Method 500 may be utilized to form an IC device, such as a processor, microprocessor, memory, FPGA, or the like, that includes at least one PCM memory cell 100.

Method 500 begins at block 502 and continues with forming a heater layer and a bottom electrode upon a bottom wire (block 504). For example, a heating layer 310 is formed on top of a substrate 302 and is formed upon bottom wire 304. A trench may be formed within the heating layer 310 thereby exposing at least a portion of an upper surface of bottom wire 304. The trench may be filled with conductive material to form bottom electrode 112 within or integral to heater layer 310.

Method 500 may continue with forming a projection liner layer upon the heater layer and upon the bottom electrode (block 506). For example, a blanket projection liner layer 110' is deposited upon the upper surface of the heating layer 310 and upon the upper surface of bottom electrode 112.

Method 500 may continue with forming a PCM stack upon the projection liner layer (block 508). For example, a PCM stack that includes PCM and a top electrode may be formed upon the projection liner layer. The PCM stack may be formed by forming a PCM layer upon the projection liner layer (block 510). For example, PCM layer 102' may be formed upon the projection liner layer 110' by depositing phase change material onto the projection liner layer 110'. The top electrode may be formed by forming a top electrode layer upon the PCM layer (block 512). For example, top electrode layer 106' may be formed upon the PCM layer 102' by depositing electrically conductive material upon the PCM layer 102'.

The PCM stack may be formed by etching the PCM layer and the top electrode layer utilizing the projection liner layer as an etch stop (block 514). For example, a mask layer 320 may be formed upon the top electrode layer 106' by depositing one or more known mask materials, such as Silicon Nitride, upon the top electrode layer 106'. A developer layer 322 may be formed upon the mask layer 320 by depositing one or more known developer materials, that may be used to pattern the underlying mask layer 320, upon the mask layer 320. Known photolithography techniques may be utilized to selectively remove, pattern, develop, etc. portions of the mask layer 320 so that the only a remaining portion of the mask layer 320 is located generally above and in line with a respective bottom electrode 112, in order to define and protect a respective PCM stack of the PCM 102 volume and top electrode 106 there below.

An etch may remove undesired or exposed PCM layer 102' material and undesired or exposed top electrode layer 106' material. The developed or patterned mask 320' portions may protect the underlying desired PCM layer 102' material and top electrode layer 106' material from the etch. The protected underlying desired PCM layer 102' material and top electrode layer 106' material is thereby retained and effectively forms the PCM stack of the PCM 102 volume and the top electrode 106. The projection liner layer is utilized as the stop layer in which the etchant of a chemical wet etch or ions of physical dry etch stop upon and exposes field portions of the projection liner layer that are outside of the formed PCM stack(s) (block 516).

Method 500 may continue with forming encapsulation spacer(s) upon the PCM stack sidewall(s) and upon the projection liner layer (block 518). For example, encapsulation spacer(s) 108 are formed upon the sidewall(s) of the PCM stack that includes the PCM 102 volume and the top electrode 106 and is formed upon the projection liner layer 110'. The encapsulation spacer(s) may be formed by forming an encapsulation layer upon the projection liner layer and upon and around the PCM stack (block 520). For example, encapsulation layer 108' may be formed by depositing dielectric material upon the exposed field portions of the projection liner layer 110' outside of the PCM stack and upon and around the formed PCM stack of the PCM 102 volume and top electrode 106.

The encapsulation spacer(s) may be further formed by etching the encapsulation layer utilizing the projection liner layer as an etch stop (block 522). For example, undesired encapsulation layer 108' portion(s) are etched away by an etch while desired encapsulation layer 108' portion(s) are retained upon the sidewall(s) of the PCM stack of the PCM 102 volume and top electrode 106 to form encapsulation spacer(s) 108. During the etching process to remove the undesired portion(s) of the encapsulation layer, the projection liner layer may again be utilized as the stop layer in which the etch stops upon and exposes field portions of the projection liner layer that are outside of the encapsulation layer 108' portions that were formed upon the sidewall(s) of the PCM stack. The etch that removes undesired encapsulation layer 108' portion(s) may further expose the upper surface of top electrode.

The desired encapsulation layer 108' portion(s) effectively form the encapsulation spacer(s) 108 and are located upon the sidewall(s) or side surface(s) of the PCM stack and the sidewalls(s) or side surface(s) of the top electrode, and are located upon the top or upper surface of the projection liner layer nearest and neighboring the PCM stack (block 524).

Method 500 may continue with etching the projection liner layer located outside of the encapsulation spacers (block 526). For example, undesired projection liner layer 110' material located outside of the encapsulation spacer(s) 108 is removed, desired projection liner layer 110' material located between the encapsulation spacer(s) 108 and heater layer 310 is retained, and desired projection liner layer 110' material located between the PCM 102 volume and heater layer 310/bottom electrode 112 are retained. The retained or desired projection liner layer 110' portion(s) effectively form the projection liner 110.

Method 500 may continue with forming a top wire upon the top electrode and upon the spacer(s) (block 528). For example, a top wire 350 is formed within an ILD 330 that is formed above the upper surface of the top electrode 106 and above the upper surface of encapsulation spacer(s) 108. A wire trench 336 may be formed within the ILD 330 exposing the upper surface of the top electrode 106 and exposing at least a portion of the upper surface of spacer(s) 108. The top wire 350 may be formed by depositing conductive material within the wire trench 336 such that the conductive material contacts the upper surface of the top electrode 106 and contacts a portion of the spacer(s) 108. A chemical mechanical polish may be utilized to planarize the top surface of the top wire 350 and the top surface of ILD 330. Method 500 may end at block 530.

Figure 15A:
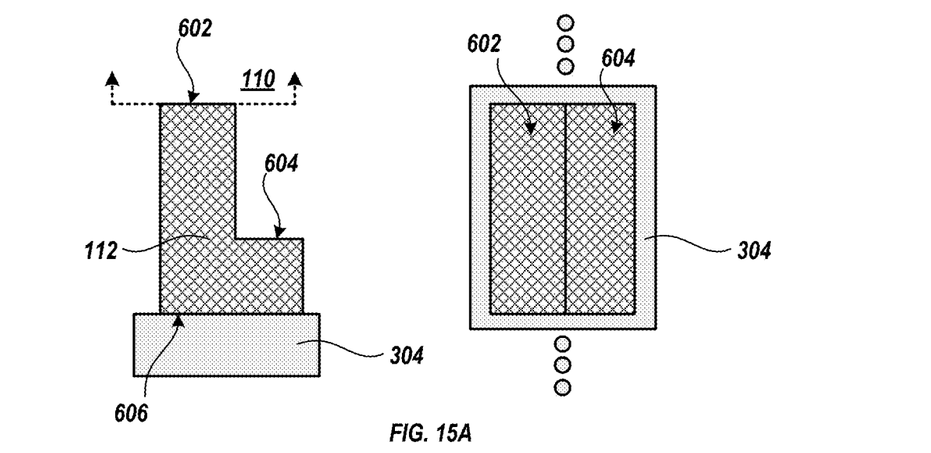
Figure 15B:
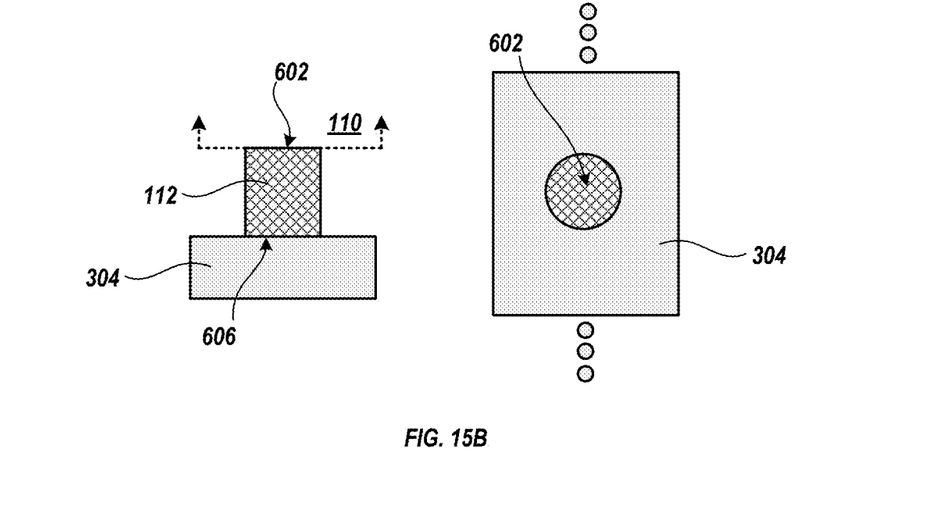

FIG. 15A and FIG. 15B depict various views of bottom electrode 112, in accordance with various embodiments of the present invention. FIG. 15A depicts cross section view of a sidewall bottom electrode 112 and a top view of the sidewall bottom electrode 112. Sidewall bottom electrode 112 includes multiple sidewalls, an upper surface 602, an intermediary surface 604, and a bottom surface 606. The upper surface 602, the intermediary surface 604, and the bottom surface 606 are substantially coplanar (i.e. coplanar plus or minus an appropriate fabrication tolerance). Upper surface 602 is connected with projection liner 110 and bottom surface 606 is connected with bottom wire 304. Sidewall bottom electrode 112 may have a lower portion that has a larger or wider perimeter or diameter relative to an upper portion. The intermediary surface 604 may be a top surface of this lower portion. The upper surface 602 may be the upper surface of the upper portion. The top view shape of the lower portion and the upper portion may be rectangular, as depicted, or alternatively may be a square, a polygonal, or a circular shape.

FIG. 15B depicts cross section view of a cylinder bottom electrode 112 and a top view of the cylinder bottom electrode 112. Cylinder bottom electrode 112 includes a circular sidewall, an upper surface 602, and a bottom surface 606. The upper surface 602 and the bottom surface 606 are substantially coplanar. Upper surface 602 is connected with projection liner 110 and bottom surface 606 is connected with bottom wire 304. The top view shape of cylinder bottom electrode 112 may be a circle, as depicted, or alternatively may be a rectangle, a square, a polygonal, or other circular shape.

According to the various embodiments, utilizing the projection liner layer 100' as an etch stop layer provides for a non-exhaustive list of various advantages: First, heater layer 310 does not need a dedicated and in place top layer, such as an oxide layer, to serve as an etch stop layer that can alter the heater layer 330 heating profile and consequently change PCM memory 100 device operation. Second, the etching processes of the formation of trench 334 to expose the underlying bottom wire 304 is simplified due to the absence of any dedicated and in place etch/top layer of the heater layer 310.

Third, the projection liner layer 110' allows for heterogenous and optimal types of etching techniques to be utilized at various stages of IC device fabrication. For example, a physical etch may be utilized to remove undesired PCM material and undesired electrode material in stage 408 utilizing the projection liner layer 110' as an etch stop while a chemical reactive ion etch may be utilized to remove undesired encapsulation layer 108' material in stage 412 also utilizing the projection liner layer 100' as an etch stop.

Fourth, the projection liner layer 110' expands known benefits of the projection liner 110 (e.g., lower drift, etc.) while increases versatility in the fabrication of the memory device 100. For example, the projection liner layer 110' etch stop of the various embodiments allows for individual engineering and optionality of the heater layer 310 dielectric to achieve an optimal heating profile of the heater layer 310, without requiring such layer to have an in place top/etch layer (e.g., oxide layer) that would impact the heating characteristics thereof. The projection liner layer 110' etch stop may also allow damage mitigation of the PCM material 102' (e.g., a physical etch may be utilized to form the PCM stacks as opposed to a chemical etch which may cause lateral etching of PCM material) during the etching of PCM stacks in stage 408. The projection liner layer 110' etch stop may also allow damage mitigation of the dielectric material of heater layer 310. For example, projection liner layer 110' material may be chosen to require a chemical etch to remove any material. In this scheme, projection liner layer 110' protects the underlying heater layer 310 dielectric from damage during a physical etch to form the PCM stacks because of the absence of the chemical etchants in the physical etch to form the PCM stacks.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

Unless described otherwise or in addition to that described herein, "deposit," "depositing," "deposited," etc. may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation.

References herein to terms such as "vertical", "horizontal", etc. are made by way of example, and not by way of limitation, to establish a frame of reference. The term "horizontal" as used herein is defined as a plane parallel to the conventional plane or surface of the substrate 302, regardless of the actual spatial orientation of the semiconductor substrate 302. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

What is claimed is:

1. An integrated circuit (IC) device fabrication method comprising:
   forming a projection liner layer upon a heating layer and upon a bottom electrode;
   forming a phase change material (PCM) layer upon the projection liner layer;
   forming a top electrode layer upon the PCM layer;
   forming a phase change material (PCM) stack upon the projection liner layer above the bottom electrode by etching away undesired PCM layer portions and undesired top electrode layer portions utilizing the projection liner layer as a first etch stop, the first etch exposing the projection liner layer outside of the PCM stack, the PCM stack comprising a phase change volume, of phase change material, and a top electrode;
   forming an encapsulation layer upon the exposed projection liner layer and upon the PCM stack; and
   forming an encapsulation spacer against sidewall(s) of the PCM stack by etching away undesired encapsulation spacer portions utilizing the projection liner layer as a second etch stop, the second etch re-exposing the projection liner layer outside of the encapsulation spacer.

2. The IC device fabrication method of claim 1, wherein the first etch is a physical dry etch.

3. The IC device fabrication method of claim 2, wherein the second etch is a chemical wet etch.

4. The IC device fabrication method of claim 1, further comprising:
   removing the re-exposed projection liner layer outside of the encapsulation layer; and
   retaining the projection liner layer under the PCM stack and under the encapsulation spacer to form a projection liner.

5. The IC device fabrication method of claim 4, wherein a side surface of the encapsulation spacer is coplanar with a side surface of the projection liner.

6. The IC device fabrication method of claim 1, further comprising:

forming a top wire upon and contacting the top electrode.

7. An integrated circuit (IC) device fabrication method comprising:

forming phase change material (PCM) stack layers upon a projection liner that is over a bottom electrode;

forming a PCM stack by etching away undesired portions of the PCM stack layers utilizing the projection liner as a first etch stop, the first etch exposing the projection liner outside of the PCM stack;

forming an encapsulation layer upon the exposed projection liner and upon the PCM stack; and forming an encapsulation spacer against sidewall(s) of the PCM stack by etching away undesired encapsulation layer portions utilizing the projection liner as a second etch stop, the second etch re-exposing the projection liner outside of the encapsulation spacer.

8. The IC device fabrication method of claim 7, wherein the encapsulation layer is a dielectric material layer.

9. The IC device fabrication method of claim 8, further comprising:

after re-exposing the projection liner, removing the re-exposed projection liner that is outside of the encapsulation spacer.

10. The IC device fabrication method of claim 9, wherein a side surface of the encapsulation spacer is coplanar with a side surface of the projection liner.

11. The IC device fabrication method of claim 7, wherein the projection liner is formed of a material with etch selectivity to the encapsulation spacer.

12. The IC device fabrication method of claim 7, wherein the first etch is a physical dry etch.

13. The IC device fabrication method of claim 12, wherein the second etch is a chemical wet etch.

14. The IC device fabrication method of claim 7, further comprising:

forming a top wire upon and contacting the PCM stack.

15. The IC device fabrication method of claim 14, wherein the top wire is further formed upon and contacts at least a portion of an upper surface of the encapsulation spacer.

* * * * *